(12) United States Patent
Hikida (10) Patent No.: US 6,515,905 B2
(45) Date of Patent: *Feb. 4, 2003

(54) NONVOLATILE SEMICONDUCTOR MEMORY DEVICE HAVING TESTING CAPABILITIES

(75) Inventor: Norihisa Hikida, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/578,915

(22) Filed: May 26, 2000

(65) Prior Publication Data

US 2001/0048609 A1 Dec. 6, 2001

(30) Foreign Application Priority Data

Jun. 3, 1999 (JP) ............................................. 11-155856

(51) Int. Cl.$^7$ ............................................. G11C 16/04
(52) U.S. Cl. ............................... 365/185.2; 365/185.11; 365/185.22; 365/185.28; 365/185.29; 365/185.21
(58) Field of Search ......................... 365/185.2, 185.11, 365/185.21, 185.22, 185.28, 185.29, 185.01

(56) References Cited

U.S. PATENT DOCUMENTS

| 5,163,021 A | * | 11/1992 | Mehrotra et al. | ......... 365/185.2 |
| 5,621,687 A | * | 4/1997 | Doller | .................... 365/185.29 |
| 5,751,647 A | * | 5/1998 | O'Toole | ....................... 365/200 |

* cited by examiner

*Primary Examiner*—Hoai Ho
(74) *Attorney, Agent, or Firm*—Arent Fox Kintner Plotkin & Kahn, PLLC (57) ABSTRACT

Included are a memory cell array 10, a sense amplifier 21 for determining a cell storage value by comparing a signal value read out from an addressed EEPROM cell with a reference value, a counter 23 for activating an error signal ERR when the count reaches a set value CNmax, and a control circuit 14 for repeating a write or erase operation on a selected cell in response to an automatic write or erase command until the storage value coincides with an expected value, loading the set value CNmax into the counter 23 prior to starting the repetitions when a test signal is active, incrementing the counter 23 at each repetition, and abnormally terminating the repetitions when the error signal is activated.

7 Claims, 9 Drawing Sheets

NONVOLATILE SEMICONDUCTOR MEMORY DEVICE HAVING TESTING CAPABILITIES

BACKGROUND OF THE INVENTION

1. Field of the Invention

The present invention generally relates to an electrically erasable, rewritable nonvolatile semiconductor memory device (EEPROM) with testability, more particularly to a semiconductor memory device such as a flash memory with an automatic write or erase function.

2. Description of the Related Art

Flash memories have been in greatly increased demand in recent years due to non-volatility, easiness of erase and rewrite operations and adoption of single transistor cells.

A flash memory cell is of a stacked gate type in which a floating gate electrode is buried in the gate oxide film of a MOS transistor, and in a read operation, a high voltage is applied to the control gate while a voltage is applied between the drain and the source of the transistor to inject channel electrons into the floating gate electrode. With this electron injection, the threshold voltage of the transistor rises.

In the flash memory, an erase operation is required before a write operation. In the erase operation, a high voltage is applied to the source while leaving the drain in an open state to release electrons held in the floating electrode by a tunnel effect. When a memory cell is over-erased, erased, the floating gate in the memory cell is charged positive and thereby, a current flows between the source and the drain even if the control gate is set to 0V, resulting in an erroneous read. In addition, there is variation in characteristics among the memory cells. Therefore, there is repeated the process of providing an erase pulse having a short width to a memory cell, performing a read operation on the memory cell and judging whether or not an erase operation has been performed properly. Also in a write operation, in order to prevent excessive write, there is repeated the process of providing a write pulse having a short width to the memory cell, performing a read operation on the memory cell and judging whether or not a write operation has been performed properly.

Such a repetition is performed automatically by a control circuit in a flash memory in response to an automatic write command or an automatic erase command, and when the repetition count exceeds a predetermined value before the operation of the automatic write or automatic erase has been completed, an error signal from the counter is activated to abnormally terminate the control operation.

However, if activation of the error signal is not transmitted to the control circuit when the number of the repetitions has exceeded the predetermined value because of a malfunction of the counter, or disconnection or short-circuiting of interconnection, the repetition is not terminated and it becomes an endless loop. Further, if no error cell is present, the excessive repetitions is not performed and therefore, a test cannot be performed on whether or not the error signal is issued normally.

SUMMARY OF THE INVENTION

Accordingly, it is an object of the present invention to provide a nonvolatile semiconductor memory in which it can be confirmed by adding a simple configuration whether or not an abnormally terminating operation is performed normally in a test prior to product shipment.

In the present invention, there is provided a nonvolatile semiconductor memory comprising a cell array, each cell having a floating gate; a sense amplifier for determining a logic value of a signal read from an addressed cell by comparing the signal with a reference signal; a counter for activating an error signal when a count thereof reaches a first predetermined value; and a control circuit, for repeating a write or erase operation on the addressed cell in response to an automatic write or erase command until the logic value reaches an expected value, for providing a counting signal to the counter at every repetition of the operation, for abnormally terminating the repetitions when the error signal has been activated, wherein the control circuit makes the counter load a second predetermined value for decreasing the number of the repetitions, prior to starting of the repetitions when a test signal is active.

With the present invention, the second predetermined value is loaded into the counter by activating the test signal in the test prior to product shipment, thereby it can be judged whether or not an error signal is outputted normally prior to a write or erase operation on a memory cell, or by smaller times of repetitions of write or erase operations. Accordingly the test can be performed with a shorter time and with certainty even if no error cell is present. Further, since in the test, the memory cell array receives no or less stress, a product lifetime will be extended.

Other aspects, objects, and the advantages of the present invention will become apparent from the following detailed description taken in connection with the accompanying drawings.

DESCRIPTION OF THE PREFERRED EMBODIMENTS

Referring now to the drawings, wherein like reference characters designate like or corresponding parts throughout several views, preferred embodiments of the present invention are described below.

First Embodiment

Figure 1:
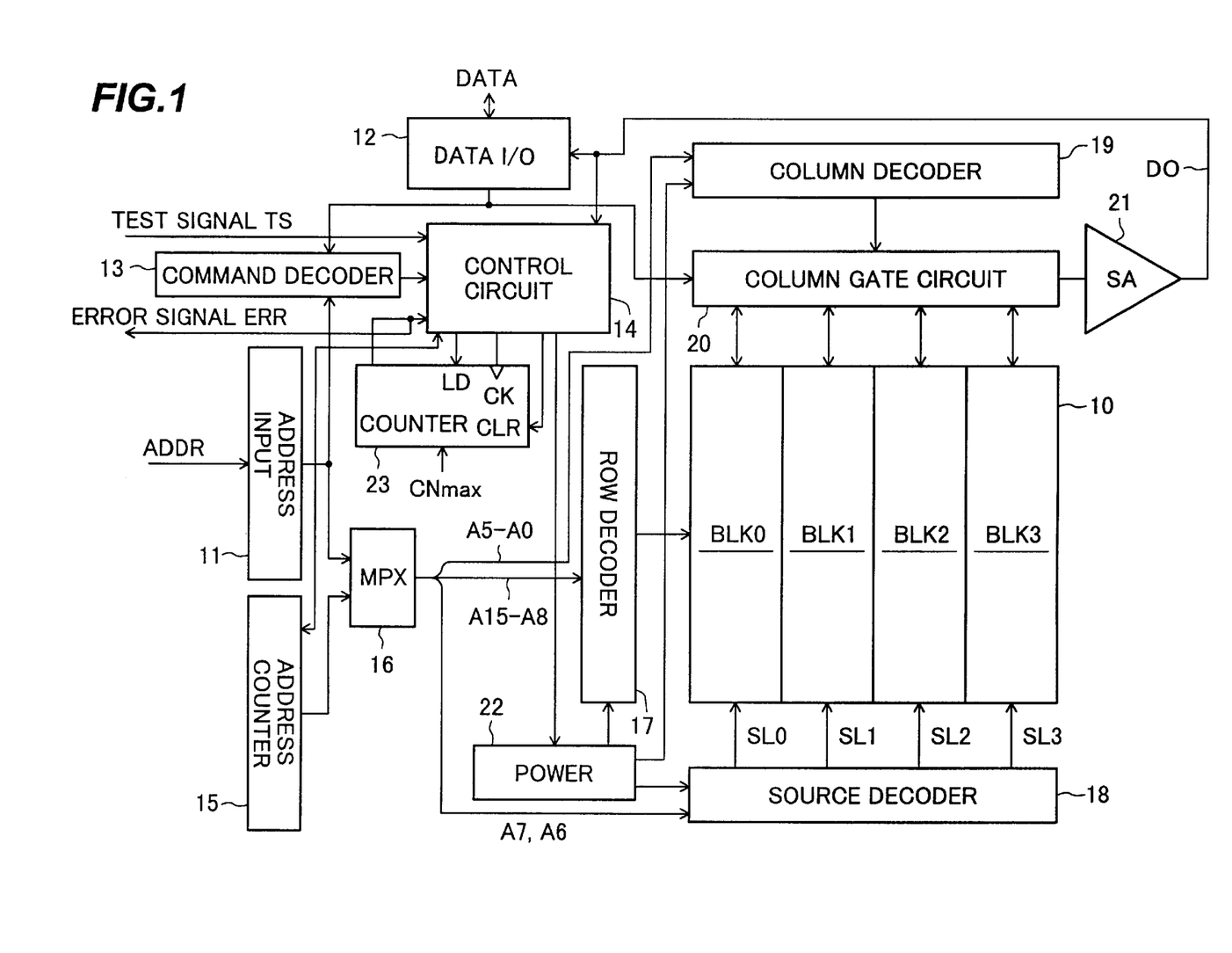
FIG. 1 is a schematic block diagram showing a flash memory of the first embodiment according to the present invention.

FIG. 1 is a schematic block diagram showing a flash memory of the first embodiment according to the present invention. A memory cell array 10 includes memory cell blocks BLK0 to BLK3 with the same configuration as one another, and memory cells are erasable in units of blocks.

Figure 2:
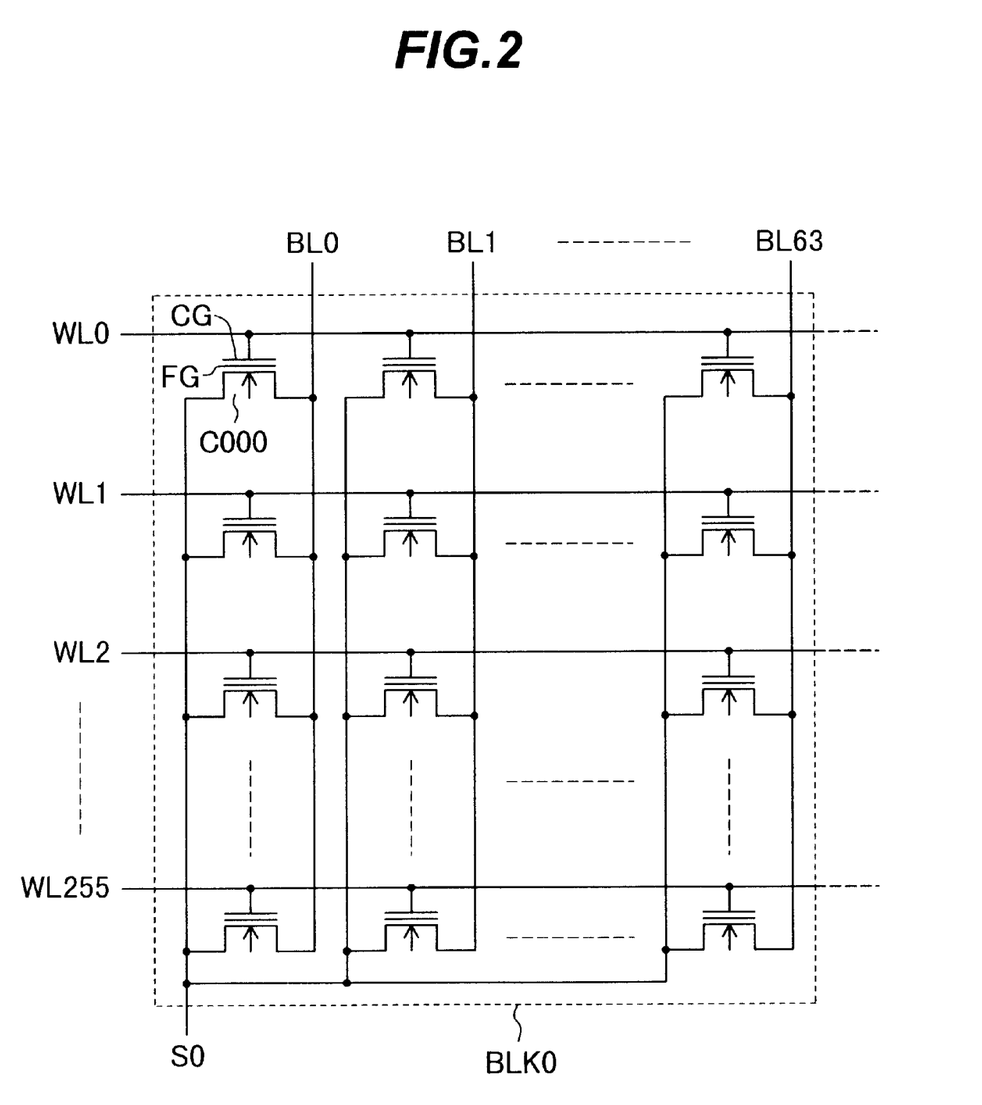
FIG. 2 is a circuit diagram of the memory cell block of FIG. 1.

FIG. 2 shows a circuit of the memory cell block BLK0. The BLK0 is a memory cell array having 256 rows and 64 columns, and each memory cell is a stacked gate EEPROM cell in which a floating gate is buried in the gate oxide film of an NMOS transistor. In regard to any i and k where i=0 to 255 and k=0 to 63, the control gates in the i-th row are connected to a word line WLi, the sources of the cell transistors in the k-th column are connected to a bit line BLk, and the sources of all the cell transistors in the memory cell block BLK0 are connected to a source line SL0. Write, erase and read operations on a memory cell are the same as those in the prior art well known to persons skilled in the art and therefore, descriptions thereof are omitted.

Referring back to FIG. 1, an address ADDR and an data DATA from the outside are provided to an address input circuit 11 and a data input circuit 12, respectively. Each of the circuits 11 and 12 has a buffer gate circuit and a buffer register connected to the buffer gate. The outputs from the address input circuit 11 and the data input circuit 12 are provided to a command decoder 13, and the decoded result is provided to a control circuit 14. The circuit 14 performs various controls to execute a read command, a write command, an erase command, an automatic write command or an automatic erase command in response to the activation thereof.

In a case where an automatic write operation or an automatic erase operation is performed with incrementing an address in a chip, the output of an address counter 15 is used. A multiplexer 16 selects one of the outputs of the address input circuit 11 and the address counter 15 in response to a control signal from the control circuit 14 and provides, for example, the upper order 8 bits A15 to A8 of the address bits A15 to A0 to a row decoder 17, the next 2 bits to a source decoder 18 and the lower order 6 bits A5 to A0 to a column decoder 19. Referring to FIG. 2, one of word lines WL0 to WL255 is selected by the output of the row decoder 17, one of the source lines SL0 to SL3 by the output of the source decoder 18 and one column switch in a column gate circuit 20 by the output of the column decoder 19.

In a case of a read operation, a signal read out from a cell selected by the row decoder 17, the source decoder 18 and the column decoder 20 is compared with a reference value, and its result is amplified by a sense amplifier 21 to transform into a data DO of '0' or '1', which is provided to the data input circuit 12 and the control circuit 14. In a case of a write operation, the DATA is provided through the data input circuit 12 and the column gate 20 to a selected bit line.

A power supply circuit 22 supplies predetermined power-supply voltages to the row decoder 17, the source decoder 18 and the column decoder 19 in response to a control signal from the control circuit 17, depending on a command from the command decoder 13. With this and address value, the voltages applied onto the word lines, source lines and bit lines are determined.

In an automatic write operation or an automatic erase operation, a counter 23 is used. To its clear input CLR, clock input CK and load control input LD, a signal from the control circuit 14 is provided. To the data loading input of the counter 23, a set value CNmax is provided. When the count of the counter 23 reaches the set value CNmax, e.g., the maximum value, the output ERR of the counter 23 is activated. The error signal ERR is not only provided to the input of the control circuit 14, but also externally outputted through an interconnection between the input and an external terminal. Further, a test signal TS is provided from an external terminal to the control circuit 14.

Next, description will be given of operation of the above-configured flash memory in a use by an end user and in a test prior to product shipment.

Figure 3:
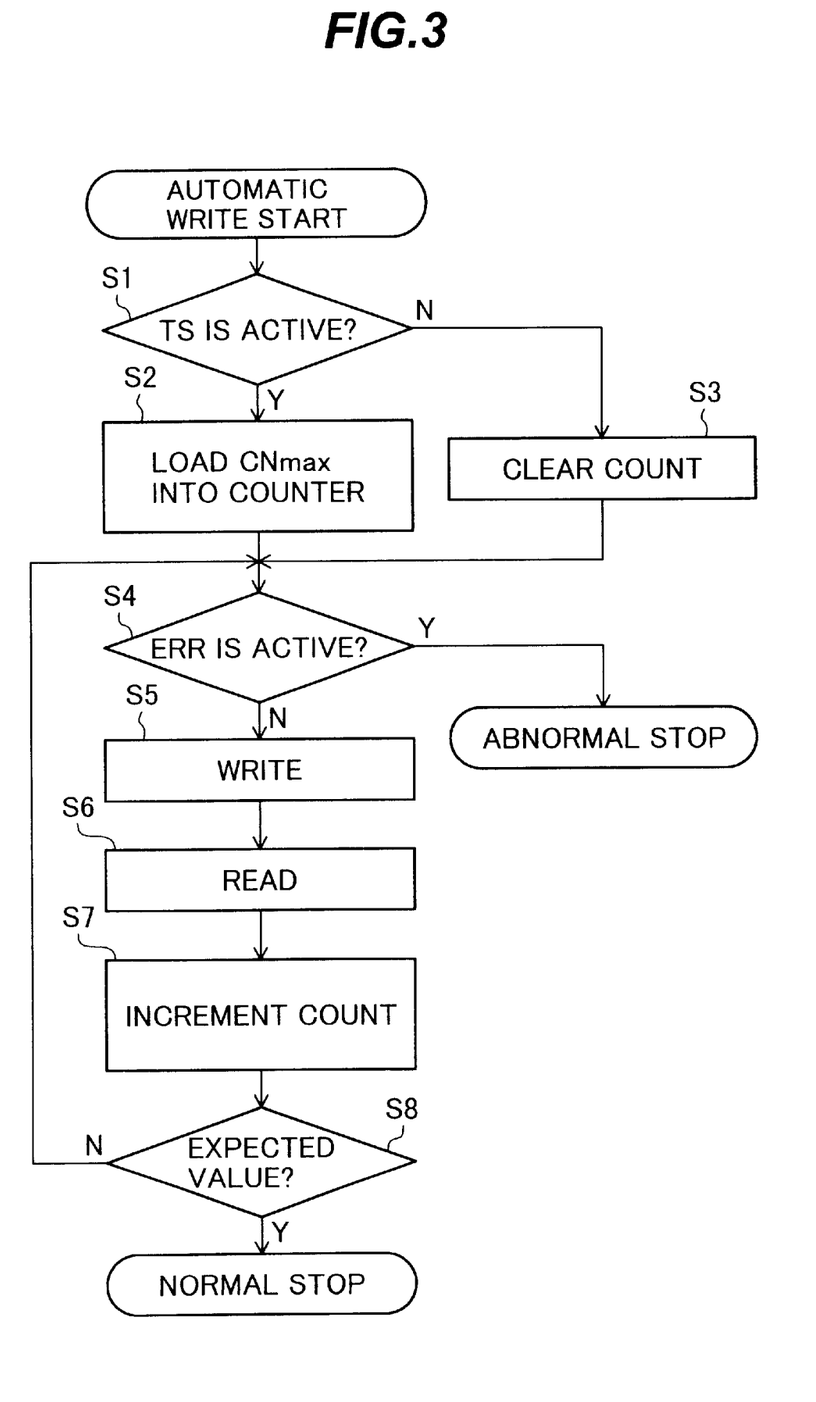
FIG. 3 is a flow chart showing an automatic write operation.

FIG. 3 is a flow chart showing an automatic write operation. Reference characters in parentheses below are step identifications in FIG. 3.

(S1) If the test signal TS is active, then the process goes to step S2, or else the process goes to step S3.

In a use by an end user, the test signal TS is inactive, while in a test, the test signal TS is activated.

(S2) When the test signal TS is active, the control circuit 14 sets the load control input LD of the counter 23 high to load the set value CNmax into the counter 23, and further returns the LD low. Then the process goes to step S4.

(S3) The control circuit 14 provides a pulse to the clear input CLR of the counter 23 to zero the count.

(S4) In a case of the test, since the error signal ERR is activated by processing of step S2, the operation of the control circuit 14 stops abnormally. A test device (not shown) can confirm whether or not the error signal is outputted normally from the flash memory by detecting whether or not the error signal ERR is active. In a case where the error signal ERR is inactive, the flash memory is regarded as defective since the automatic write operation or automatic erase operation in the use by a end user gets into an endless loop.

In cases of the flash memory being in use by an end user or being defective, the process goes to step S5 since the error signal ERR is inactive. In the case of use by an end user, when the error signal ERROR is activated after repetitions of from step S4 to step S8 at CNmax times, the operation of the control circuit 14 stops abnormally.

(S5) A write operation is performed on a selected cell of the memory cell 10.

(S6) A read operation is performed on the selected cell.

(S7) The control circuit 14 provides a pulse to the clock input CL of the counter 23 to increment the count thereof.

(S8) If the data DO is not equal to an expected value, that is, a value to be written, the process returns to step S4, or else the control circuit 14 normally completes a write operation for one address.

In a case where write operations are performed sequentially on a plurality of memory cells in use by an end user, the process of FIG. 3 is performed every time when the content of the address counter 15 changes.

Figure 4:
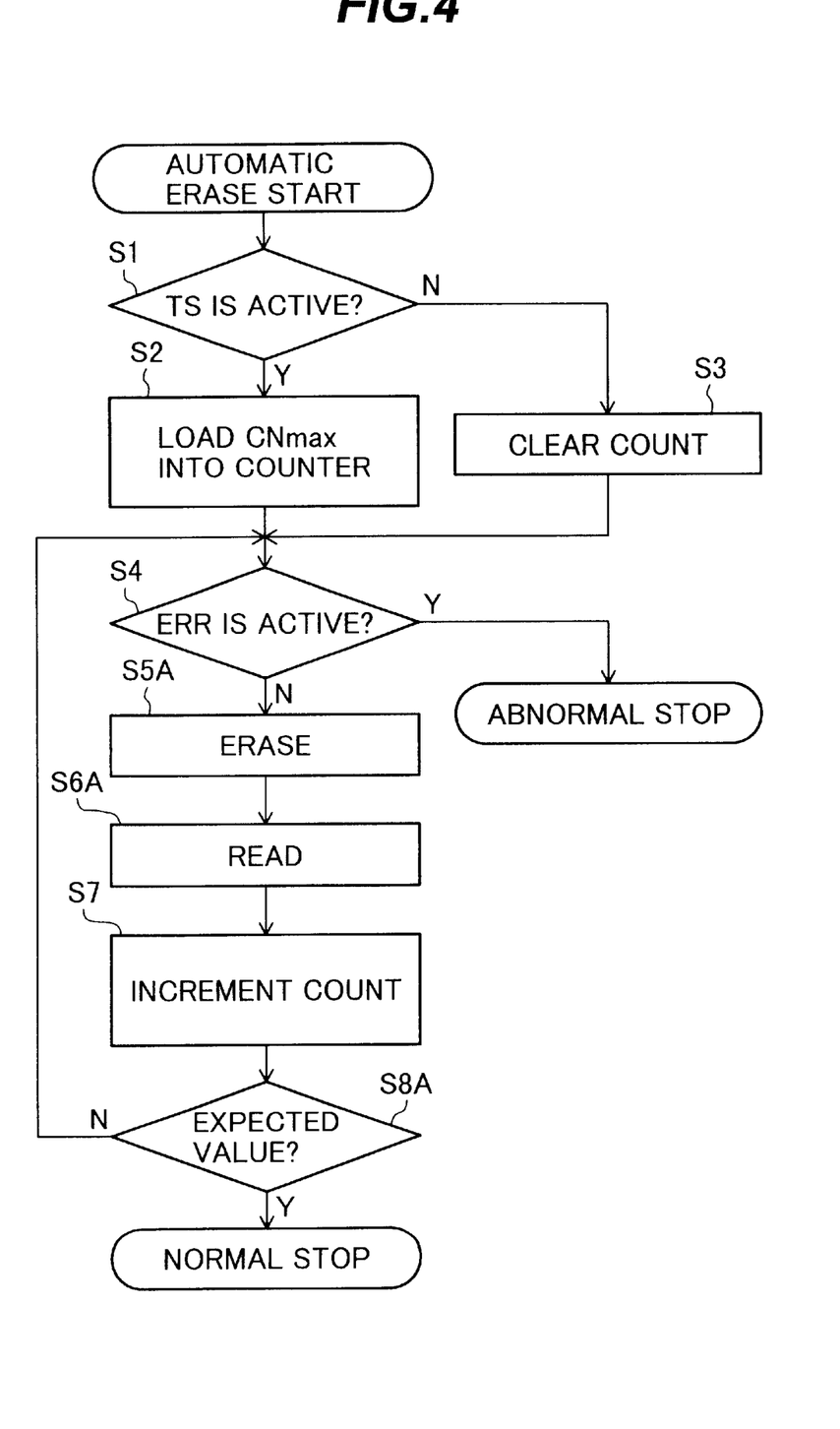
FIG. 4 is a flow chart showing an automatic erase operation on a selected cell row of a selected memory cell block.

FIG. 4 is a flow chart showing an automatic erase operation on a selected cell row of a selected memory block. The fundamental operation of the automatic erase operation is the same as that of the automatic write operation.

In step S5A, the erase operation on a selected cell row is carried out by one time. In correspondence to this, in step S6A, read operations are performed on the cells of a selected row and step S8A, it is judged whether or not all of the cells of the row are equal to an expected value.

The process of FIG. 4 is carried out sequentially and automatically on each cell row of a memory cell block to be erased.

In a test prior to product shipment of the flash memory of the first embodiment, by activating the test signal TS, the set value CNmax is loaded into the counter 23 and it can be confirmed whether or not the error signal ERR is outputted normally, prior to execution of a write operation or an erase operation on a memory cell, and therefore, the test can be carried out at a high speed and with certainty even if no error cell is present. Further, since in the test, no stress is imposed on the memory cell array 10, a product lifetime will be extended.

Second Embodiment

Figure 5:
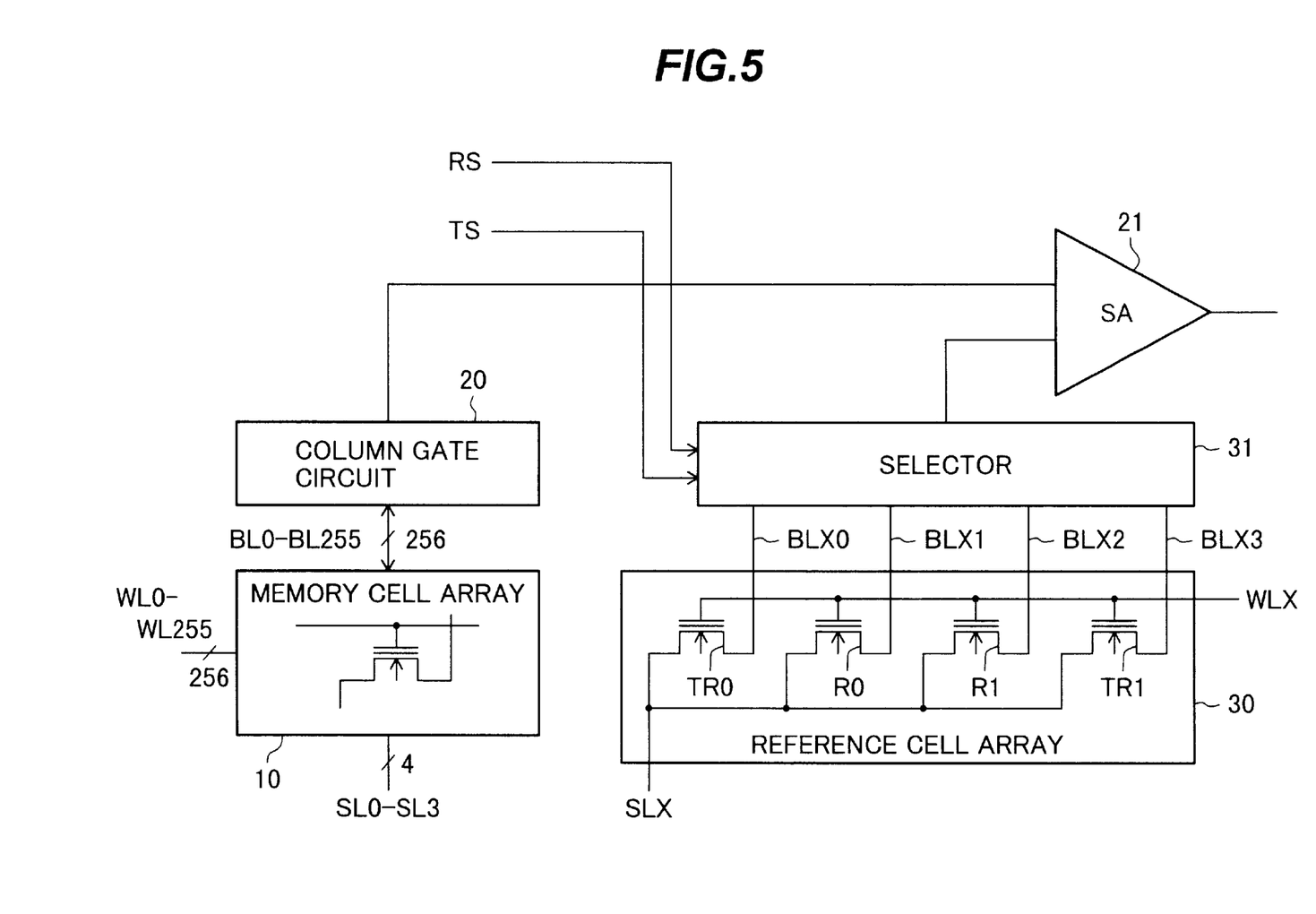
FIG. 5 is a schematic circuit diagram showing part of a flash memory of the second embodiment according to the present invention.

FIG. 5 is a schematic circuit diagram showing part of a flash memory of the second embodiment according to the present invention. In the following description, a cell in a written state is referred to as being "0" state and a cell in an erased state as being "1" state.

An output of a reference cell array 30 is provided through a selector 31 to a sense amplifier 21 as a reference signal. The reference cell array 30 includes a "0" judgment reference cell TR0 in a test, a "0" judgment reference cell R0 in a normal use, a "1" judgment reference cell R1 in a normal use, and a "1" judgment reference cell TR1 in a test, wherein the cells are all same as those of the memory cell array 10 in configuration and size. In FIG. 5, for simplicity of description, reference cells used in execution of a read command is omitted.

Figure 6:
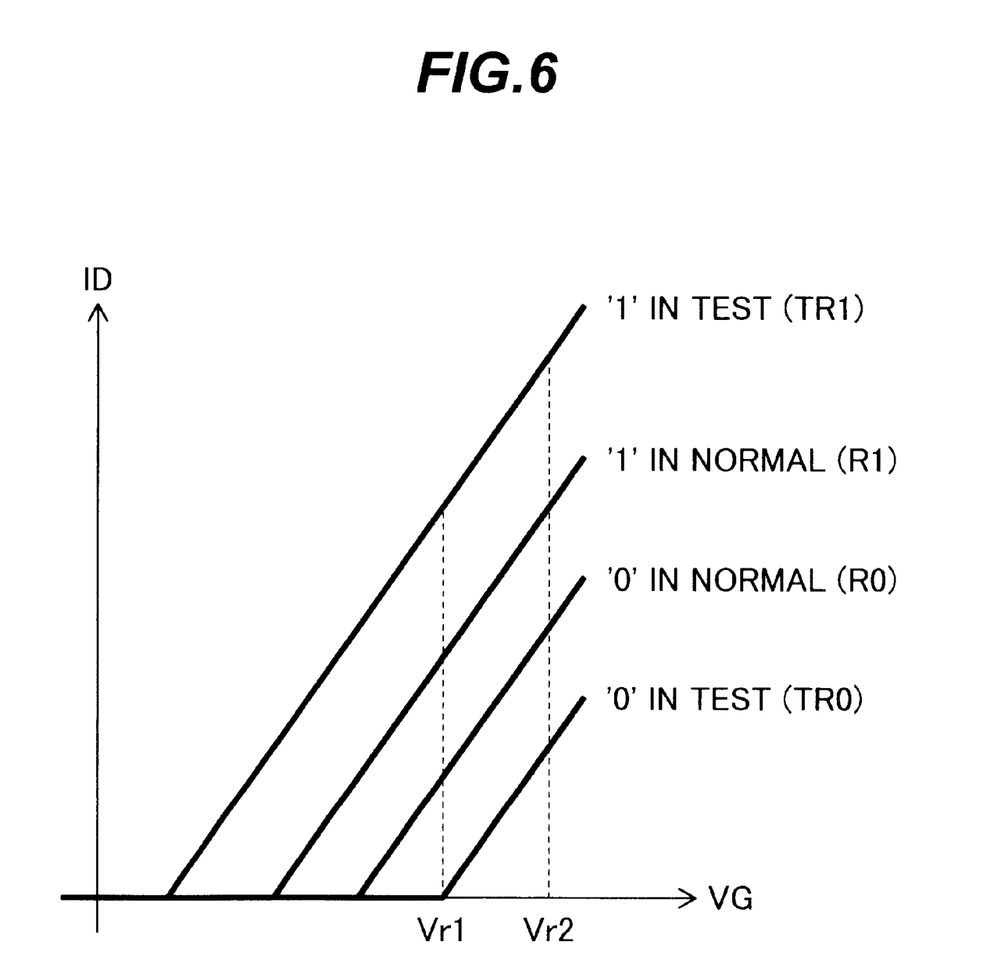
FIG. 6 is a graph of characteristics of relations between control gate voltages and drain currents of the four reference cells of FIG. 5.

To the floating gates of the reference cells TR0, R0, R1 and TR1, electrons are injected such that each of the relations between the control gate voltages VG and the drain currents ID is as shown in FIG. 6. In the reference cells, the sources are connected to a source line SLX, the control gates to a word line WLX and the drains through bit lines BL0 to BL3 to the respective inputs of a selector 31. To the selection control input of the selector 31, there are provided a reference cell selection signal RS and the test signal TS. The signal RS is outputted from the control circuit 14 of FIG. 1. Assume that the signal RS has a logic value '0 ' in a write operation and a logic value '1' in an erase operation.

In this embodiment, in FIG. 1, no signal is provided from the control circuit 14 to the load control input LD of the counter 23, and no set value CNmax is loaded into the counter 23 either.

Figure 7:
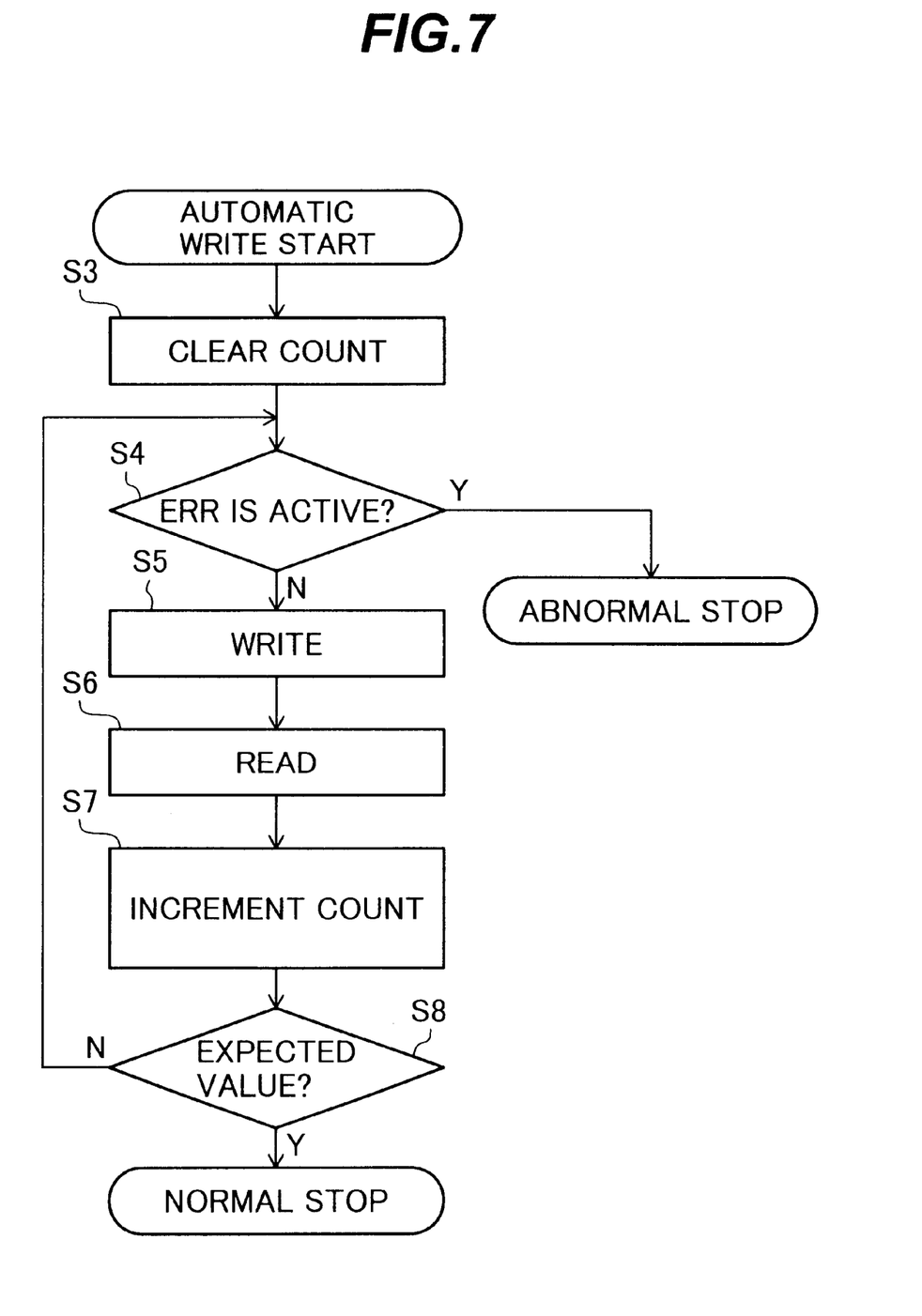
FIG. 7 is a flow chart showing an automatic write operation.
Figure 8:
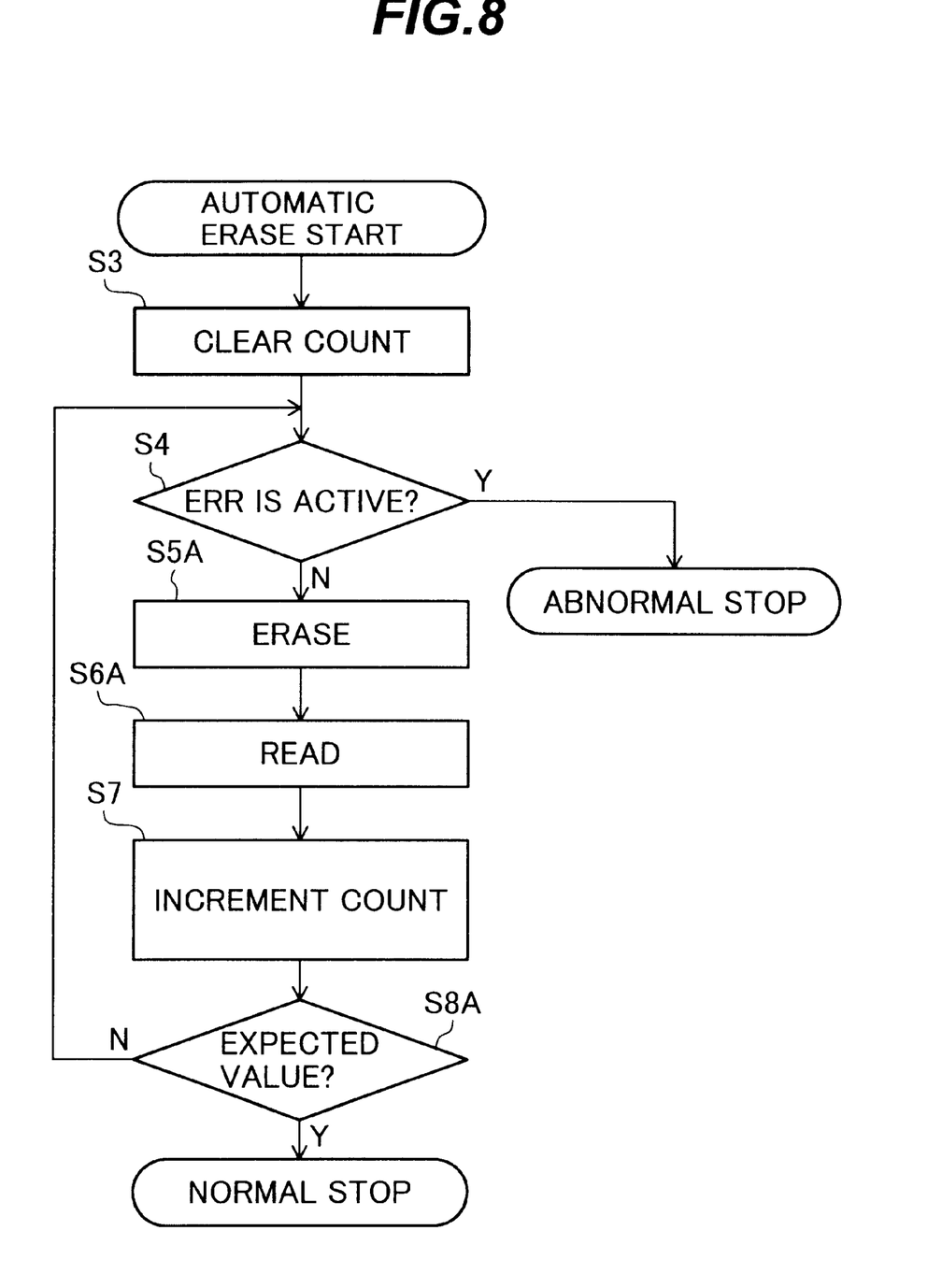
FIG. 8 is a flow chart showing an automatic erase operation on a selected cell row of a selected memory cell block.

FIGS. 7 and 8 are similar to FIGS. 3 and 4, respectively, and same as FIGS. 3 and 4 with the exception that steps S1 and S2 of FIGS. 3 and 4 are omitted.

In a case of the automatic write operation, in step S5 of FIG. 7, RS='0'. In step S6 of FIG. 7, TS='0 ' in normal use (in use by an end user), the bit line BLX1 is selected and the word line WLX is applied with a voltage Vr1, while TS='1' in a test, the bit line BLX0 is selected and the word line WLX is applied with a voltage Vr2. Since in the test, the threshold voltage of the reference transistor TR0 is higher, in step S8 of FIG. 7, no coincidence is judged every time, and the count of the counter 23 reaches to the CNmax if a selected cell of the memory cell 10 is normal. Therefore, the error signal ERR of FIG. 1 is activated and an operation of the control circuit 14 stops abnormally if normal, or else the error signal ERR stays inactive.

In a case of the automatic erase operation, in step S5A of FIG. 8, RS='1'. In step S6A of FIG. 8, TS='0 ' in the normal use, the bit line BLX2 is selected and the word line WLX is applied with the voltage Vr1, while TS='1' in the test, the bit line BLX3 is selected and the word line WLX is applied with the voltage Vr1. Since in the test, the threshold voltage of the reference transistor TR1 is lower, in step S8A of FIG. 8, no coincidence is judged every time, and the count of the counter 23 reaches to the CNmax if a selected cell of the memory cell 10 is normal. Therefore, the error signal ERR of FIG. 1 is activated and an operation of the control circuit 14 stops abnormally if normal, or else the error signal ERR stays inactive.

According to the second embodiment, in the automatic write operation and the automatic erase operation, the count of the counter 23 reaches the set value by repeat even if no error cell is present, the error signal ERR is activated and thereby, the same test as that of the first embodiment can be carried out.

Third Embodiment

Figure 9:
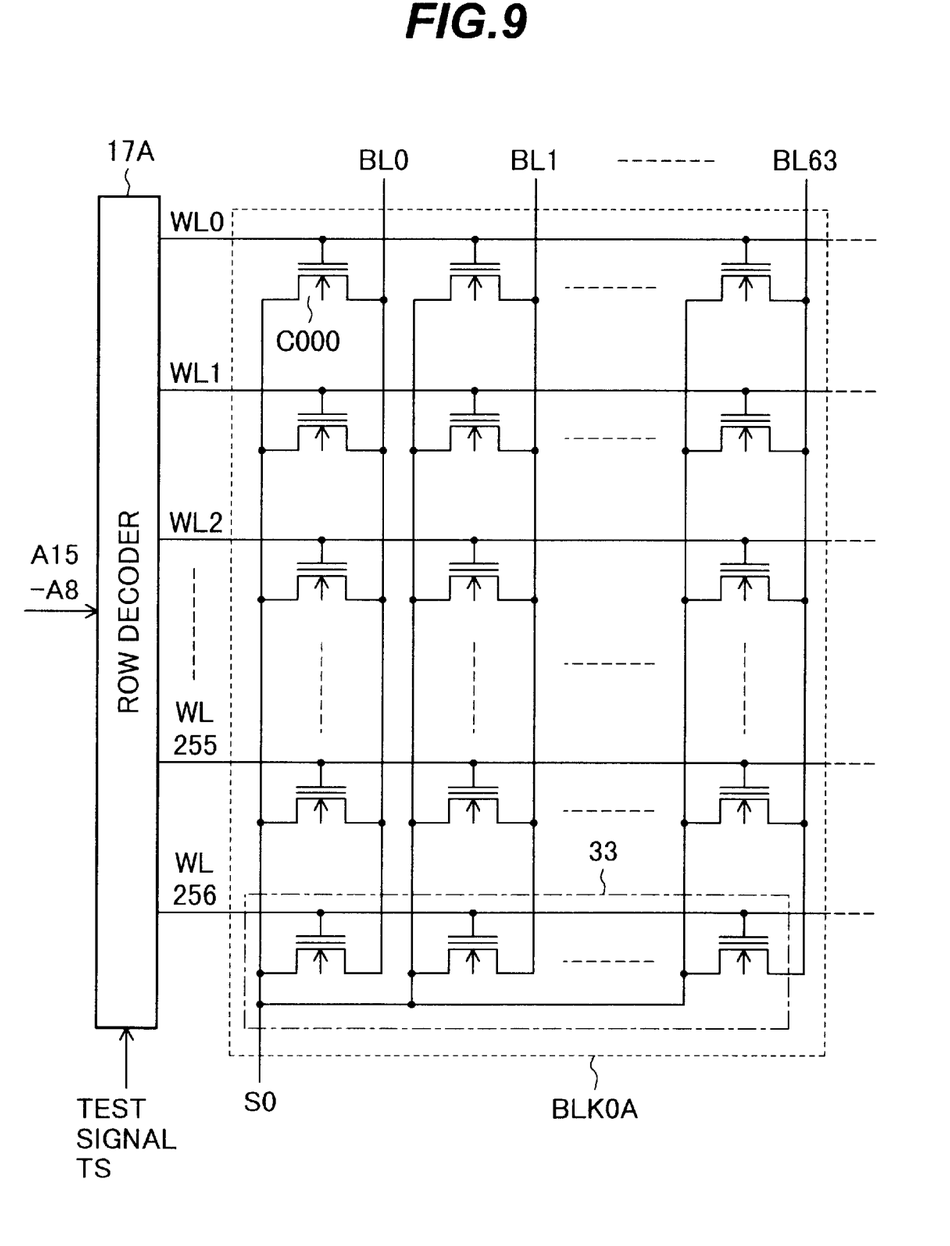
FIG. 9 is a circuit diagram showing one memory cell block and one row decoder of a flash memory of the third embodiment according to the present invention.

FIG. 9 shows one memory block BLK0A and one row decoder 17A of a flash memory of the third embodiment according to the present invention.

The memory block BLK0A has a configuration in which a redundant cell row 33 is added to the memory cell block BLK0 of FIG. 2. To the row decoder 17A, the row address bits A15 to A8 and the test signal TS are provided. In a case where the test signal TS is inactive, one of the word lines WL0 to WL255 are selected same as the case of FIG. 2 in response to the row address bits A15 to A8. In a case where the test signal is active, none of the word lines WL0 to WL255 are selected regardless of the row address bits A15 to A8, and a word line 256 is selected.

Since in the test, with the selection of the word line 256, the automatic write operation or the automatic erase operation is repeated on the redundant cell row 33, no stress is imposed on the memory cell array used by a user, thereby extending the lifetime thereof.

The other points are the same as the second embodiment.

Although preferred embodiments of the present invention has been described, it is to be understood that the invention is not limited thereto and that various changes and modifications may be made without departing from the spirit and scope of the invention.

For example, a down-counter may be adopted as the counter 23 of FIG. 1, and in the automatic write operation, in normal use, the set value CNmax is loaded into the counter 23, while in a test, the counter is cleared to zero. And when a count of the counter 23 is 0 or −1, the error signal is activated. This is applicable to a case of the automatic erase operation. Different set values CNmax may be used in cases of the automatic write operation and the automatic erase operation.

What is claimed is:

1. A nonvolatile semiconductor memory device comprising:

a cell array, each cell having a floating gate;

a sense amplifier for determining a logic value of a signal read from an addressed cell by comparing said signal with a reference signal;

a counter for activating an error signal when a count thereof is equal to a predetermined value; and a control circuit, for repeating a write or erase operation on said addressed cell in response to an automatic write or erase command until said logic value reaches an expected value, for providing a counting signal to said counter at every repetition of said operation, for abnormally terminating said repetitions when said error signal has been activated, wherein said control circuit makes said counter load said predetermined value prior to starting of said repetitions when a test signal is active, so as to confirm whether or not said error signal is activated normally even if no error cell is present, without imposing any stress on the cell array.

2. A nonvolatile semiconductor memory device comprising:
   a cell array, each cell having a floating gate;
   a sense amplifier for determining a logic value of a signal read from an addressed cell by comparing said signal with a reference signal;
   a counter for activating an error signal when a count thereof reaches a predetermined value; and
   a control circuit, for repeating a write or erase operation on said addressed cell in response to an automatic write or erase command until said logic value reaches an expected value, for providing a counting signal to said counter at every repetition of said operation, for abnormally terminating said repetitions when said error signal has been activated, and for receiving a test signal,
   wherein said control circuit causes said reference value to change such one that said logic value cannot coincide with said expected value even if said repeating have been performed until said count reaches said predetermined value when said test signal is active, so as to confirm whether or not said count reaches said predetermined value and said error signal is activated normally, even if no error cell is present.

3. A nonvolatile semiconductor memory device according to claim 2, further comprising:
   first and second reference cells, each reference cell having a floating gate; and
   a selector for selecting said first reference cell when said test signal is inactive while selecting said second reference cell when said test signal is active,
   wherein said sense amplifier uses a signal selected by said selector as said reference signal,
   wherein said reference signal is determined by an electric charge amount stored on the floating gate of the selected reference cell.

4. A nonvolatile semiconductor memory device according to claim 3, wherein said second reference cell is used when said write operation is performed, and said first reference cell has a lower threshold voltage than the threshold voltage of said second reference cell.

5. A nonvolatile semiconductor memory device according to claim 4, wherein said cell array has a cell row addressable only in said test.

6. A nonvolatile semiconductor memory device according to claim 3, wherein said second reference cell is used when said erase operation is performed, and said first reference cell has a higher threshold voltage than the threshold voltage of said second reference cell.

7. A nonvolatile semiconductor memory device according to claim 6, wherein said cell array has a cell row addressable only in said test.

* * * * *